(12) United States Patent
Kim et al.

(10) Patent No.: US 12,740,243 B2
(45) Date of Patent: Sep. 15, 2026

(54) DISPLAY DEVICE

(71) Applicant: Samsung Display Co., LTD., Yongin-si (KR)

(72) Inventors: Keunwoo Kim, Seongnam-si (KR); Taewook Kang, Seongnam-si (KR); Sanggun Choi, Suwon-si (KR); Shin Il Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1136 days.

(21) Appl. No.: 17/750,565

(22) Filed: May 23, 2022

(65) Prior Publication Data

US 2022/0392986 A1 Dec. 8, 2022

(30) Foreign Application Priority Data

Jun. 7, 2021 (KR) ........................ 10-2021-0073737

(51) Int. Cl.
*H10K 59/121* (2023.01)
*H10K 59/131* (2023.01)

(52) U.S. Cl.
CPC ..... *H10K 59/1216* (2023.02); *H10K 59/1213* (2023.02); *H10K 59/131* (2023.02)

(58) Field of Classification Search
CPC ............. H10K 59/1213; H10D 86/481; G09G 2300/0426
See application file for complete search history.

(56) References Cited

U.S. PATENT DOCUMENTS

| | | | | |
|---|---|---|---|---|
| 12,439,692 | B2 * | 10/2025 | Lu | G09G 3/3208 |
| 2015/0170563 | A1 | 6/2015 | Bang | |
| 2018/0033849 | A1 * | 2/2018 | Noh | H10D 86/471 |
| 2019/0355799 | A1 * | 11/2019 | Jeong | H10K 59/124 |
| 2020/0312890 | A1 * | 10/2020 | Oikawa | H10D 30/6723 |
| 2021/0090494 | A1 | 3/2021 | Hwang et al. | |
| 2021/0280652 | A1 | 9/2021 | Kim et al. | |

FOREIGN PATENT DOCUMENTS

| | | | |
|---|---|---|---|
| CN | 113363290 | A | 9/2021 |
| KR | 100485531 | B1 | 4/2005 |
| KR | 20200049738 | A | 5/2020 |
| KR | 1020200093718 | A | 8/2020 |
| KR | 20210034135 | A | 3/2021 |
| KR | 1020210113513 | A | 9/2021 |

* cited by examiner

*Primary Examiner* — Mounir S Amer
(74) *Attorney, Agent, or Firm* — CANTOR COLBURN LLP

(57) ABSTRACT

A display device includes in order along a thickness direction of the display device an active pattern including a first region, a second region spaced apart from the first region in a first direction, and a third region between the first region and the second region, a first capacitor electrode which overlaps the third region of the active pattern to define portions of a driving transistor, and a second capacitor electrode which overlaps the first capacitor electrode and defines a groove corresponding to a portion of the first capacitor electrode.

19 Claims, 18 Drawing Sheets

IL3
IL2
IL1
ATV
SUB
I
I'
H
GR
CE1
CE2
A2
A3E
A3
A3O
A1

IL3
IL2
IL1
ATV
SUB
II
II'
H
H
GW
GW_H
GW_V
S(N+1)
A4
A7
A5
A8
A6

IL3
IL2
IL1
ATV
SUB
III
III'
H
H
H
A11
A13
GI
GI
VINT
A100
A10E
A10
A12
A9

ATV+C1+C2"+C3

DISPLAY DEVICE

This application claims priority to Korean Patent Application No. 10-2021-0073737, filed on Jun. 7, 2021, and all the benefits accruing therefrom under 35 U.S.C. § 119, the content of which in its entirety is herein incorporated by reference.

BACKGROUND

1. Field

Embodiments of the invention relate generally to a display device. More particularly, embodiments of the invention relate to a display device including an organic light emitting element.

2. Description of the Related Art

A display device may include a pixel. The pixel may receive an electric signal, and emit light having a luminance corresponding to an intensity of the electric signal.

The pixel may include at least one transistor. The transistor may include an active layer which is affected by hydrogen flowing into the active layer.

SUMMARY

A transistor of a display device may include an active layer defining a source region, a drain region and an active region. Hydrogen which flows into the source region and a portion of the active region which is adjacent to the source region, may deteriorate a performance of the transistor. Accordingly, a performance of the display device may be deteriorated.

Embodiments provide a display device with improved display performance.

An embodiment of a display device includes an active pattern including a first region, a second region spaced apart from the first region in a first direction, and a third region between the first region and the second region, a first capacitor electrode on the active pattern, where at least a portion of the first capacitor electrode overlaps the third region to define a driving transistor, and a second capacitor electrode on the first capacitor electrode, and at least a portion of the second capacitor electrode overlaps the first capacitor electrode. The second capacitor electrode defines a groove, and the groove exposes a portion of the first capacitor electrode adjacent to the second region to outside the second capacitor electrode.

In an embodiment, an outer shape (e.g., planar shape) of the groove may be the same as an outer shape of the second capacitor electrode.

In an embodiment, the first region may be a source region of the driving transistor, the second region may be a drain region of the driving transistor, and the third region may be an active region of the driving transistor.

In an embodiment, the third region may include a first overlapping region overlapping the second capacitor electrode, and a first opening (e.g., exposed) region not overlapping the second capacitor electrode.

In an embodiment, the first opening region may be adjacent to the second region, and the first overlapping region may be adjacent to the first region.

In an embodiment, an area of the first opening region may be smaller than an area of the first overlapping region.

In an embodiment, the active pattern may further include a fourth region adjacent to the second region, a fifth region spaced apart from the fourth region in a second direction crossing the first direction, a sixth region spaced apart from the fifth region in a direction opposite to the first direction, a seventh region between the fourth region and the fifth region, and an eighth region between the fifth region and the sixth region.

In an embodiment, the display device may further include a scan line in a same layer as the first capacitor electrode, including an extension part extending in the first direction and a protrusion part protruding in the second direction, and spaced apart from the first capacitor electrode in the second direction.

In an embodiment, at least a portion of the protrusion part may overlap the eighth region to define a first compensation transistor, and at least a portion of the extension part may overlap the seventh region to define a second compensation transistor.

In an embodiment, the fourth region may be a source region of the second compensation transistor, the fifth region may be a drain region of the second compensation transistor and a source region of the first compensation transistor, the sixth region may be a drain region of the first compensation transistor, the seventh region may be an active region of the second compensation transistor, and the eighth region may be an active region of the first compensation transistor.

In an embodiment, the display device may further include a bridge electrode on the second capacitor electrode, and connecting the sixth region and the first capacitor electrode.

In an embodiment, the bridge electrode may be connected to the portion of the first capacitor electrode exposed by the groove of the second capacitor electrode.

In an embodiment, the display device may further include a stabilization pattern in a same layer as the second capacitor electrode, and spaced apart from the second capacitor electrode in the second direction.

In an embodiment, at least a portion of the stabilization pattern may overlap the fifth region.

In an embodiment, the active pattern may further include a ninth region connected to the second region, a tenth region spaced apart from the ninth region in the second direction, an eleventh region spaced apart from the tenth region in a second direction crossing to the first direction and spaced apart from the ninth region in the first direction, a twelfth region between the ninth region and the tenth region, and a thirteenth region between the tenth region and the eleventh region.

In an embodiment, the display device may further include a initialization control line in a same layer as the first capacitor electrode, spaced apart from the first capacitor electrode in the second direction, and extending in the first direction.

In an embodiment, at least a portion of the initialization control line may overlap the twelfth region and the thirteenth region to define a first initialization transistor and a second initialization transistor, respectively.

In an embodiment, the display device may further include an initialization voltage line in a same layer as the second capacitor electrode, spaced apart from the second capacitor electrode in the second direction, and extending in the first direction.

In an embodiment, at least a portion of the initialization voltage line may overlap the tenth region.

In an embodiment, the tenth region may include a second overlapping region overlapping the initialization voltage line and adjacent to the thirteenth region, and a second opening (e.g., exposed) region adjacent to the twelfth region and not overlapping the initialization voltage line.

One or more embodiment of the display device may include the second capacitor electrode having the groove exposing the portion of the first capacitor electrode adjacent to (e.g., closest to) the second region. Accordingly, the first capacitor electrode and the second capacitor electrode may block hydrogen from flowing into the first region and the third region which is adjacent to the first region. In addition, hydrogen may flow into the second region and the third region which is adjacent to the second region through an upper surface of the first capacitor electrode exposed by the groove of the second capacitor electrode.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
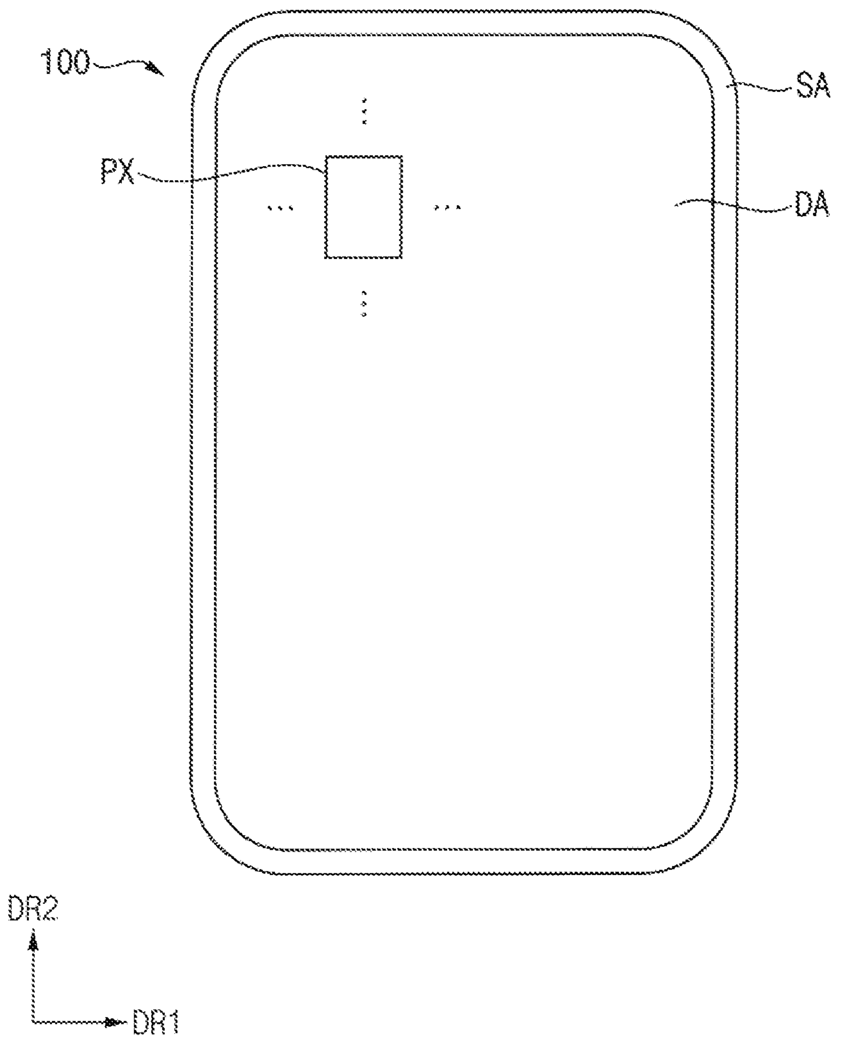
FIG. 1 is a plan view illustrating an embodiment of a display device.

Illustrative, non-limiting embodiments will be more clearly understood from the following detailed description in conjunction with the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating an embodiment of a display device 100.

Referring to FIG. 1, a display device 100 may include a display area DA and a peripheral area SA which is adjacent to the display area DA, such as surrounding the display area DA.

The display area DA may be an area (e.g., planar area) displaying an image. In the display area DA, the display device 100 may include a pixel PX. The pixel PX may be provided in plural including a plurality of pixels PX arranged in matrix form along a first direction DR1 and a second direction DR2 which crosses the first direction DR1. In an embodiment, the second direction DR2 may be perpendicular to the first direction DR1. The pixel PX may emit light. The display device 100 may display an image by combining the light emitted from the pixels PX.

The peripheral area SA may be an area which does not display an image (e.g., non-display area). A driver for driving the pixel PX may be disposed in the peripheral area SA. The driver may be electrically connected to the pixel PX.

In an embodiment, the peripheral area SA may be omitted. In this case, the driver may be disposed in the display area DA.

Figure 2:
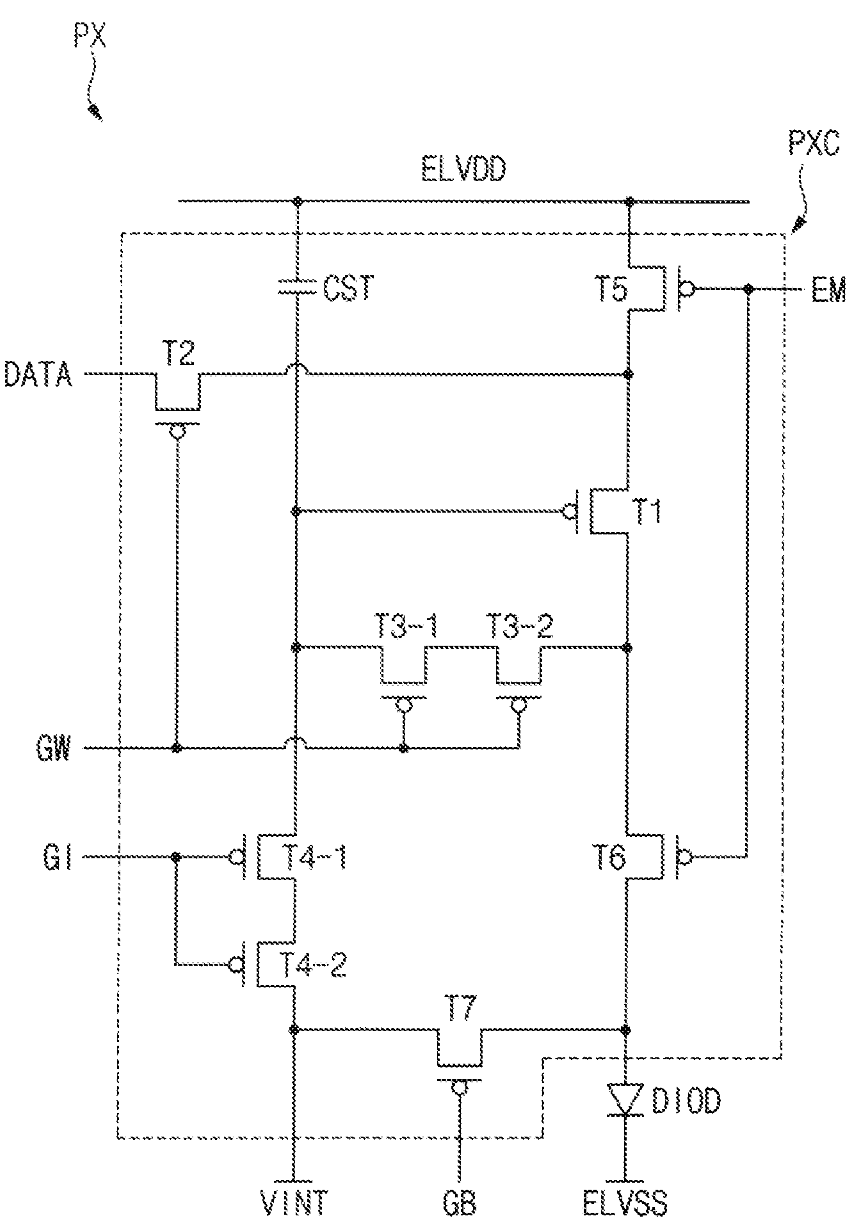
FIG. 2 is a circuit diagram illustrating an embodiment of a pixel included in the display device of FIG. 1.

FIG. 2 is a circuit diagram illustrating an embodiment of a pixel PX included in the display device 100 of FIG. 1.

Referring to FIG. 2, a pixel PX may include a pixel circuit PXC and a light emitting diode DIOD as a light-emitting element. The pixel circuit PXC may include first to seventh transistors T1, T2, T3-1, T3-2, T4-1, T4-2, T5, T6, and T7 and a capacitor CST.

The first transistor T1 may be electrically connected to a first power voltage line ELVDD and an anode electrode of the light emitting diode DIOD, and may provide a driving current (e.g., electrical current) corresponding to a data signal as an electrical signal provided by a data line DATA to the light emitting diode DIOD. In other words, the first transistor T1 may be a driving transistor.

The second transistor T2 may be connected between the data line DATA and a source electrode of the first transistor T1, and may transmit the data signal to the first transistor T1 in response to a scan signal as an electrical signal provided by a scan line GW. In other words, the second transistor may be a switching transistor.

The third transistor may be connected between a gate electrode of the first transistor T1 and a drain electrode of the first transistor T1. The third transistor may compensate a threshold voltage of the first transistor T1 by diode-connecting the first transistor T1 in response to the scan signal. In other words, the third transistor may be a compensation transistor.

In an embodiment, the third transistor may be a dual gate transistor including a first compensation transistor T3-1 and a second compensation transistor T3-2.

The fourth transistor may be connected between an initialization voltage line VINT and the gate electrode of the first transistor T1. The fourth transistor may provide an initialization voltage provided by the initialization voltage line VINT to the gate electrode of the first transistor T1 in response to a first initialization control signal as an electrical signal provided by a initialization control line GI. In other words, the fourth transistor may be a driving initialization transistor.

In an embodiment, the fourth transistor may be a dual gate transistor including a first initialization transistor T4-1 and a second initialization transistor T4-2.

The fifth transistor T5 may be connected between the first power voltage line ELVDD and the source electrode of the first transistor T1. The sixth transistor T6 may be connected between the drain electrode of the first transistor T1 and the anode electrode of the light emitting diode DIOD. Each of the fifth transistor T5 and the sixth transistor T6 may provide the driving current to the anode electrode of the light emitting diode DIOD in response to a light emitting control signal as an electrical signal provided by a light emitting control line EM. In other words, each of the fifth transistor T5 and the sixth transistor T6 may be a light emitting control transistor.

The seventh transistor T7 may be connected between the initialization voltage line VINT and the anode electrode of the light emitting diode DIOD. The seventh transistor T7 may provide the initialization voltage provided by the initialization voltage line VINT to the anode electrode of the light emitting diode DIOD in response to a second initialization control signal as an electrical signal provided by a second initialization control line GB. In other words, the seventh transistor T7 may be a diode initialization transistor.

The capacitor CST may be connected between the first power voltage line ELVDD and the gate electrode of the first transistor T1. In an embodiment, for example, a first electrode of the capacitor CST may be connected to the gate electrode of the first transistor T1, and a second electrode of the capacitor CST may be connected to the first power voltage line ELVDD. The capacitor CST may maintain a voltage between the first power voltage line ELVDD and the gate electrode of the first transistor T1.

The light emitting diode DIOD may be connected between a drain electrode of the sixth transistor T6 and a second power voltage line ELVSS. The light emitting diode DIOD may emit light based on the driving current.

FIG. 3, FIG. 4, FIG. 5, FIG. 6, FIG. 7, FIG. 8, FIG. 9, and FIG. 10 are diagrams illustrating plan views of the display device 100 of FIG. 1.

Figure 3:
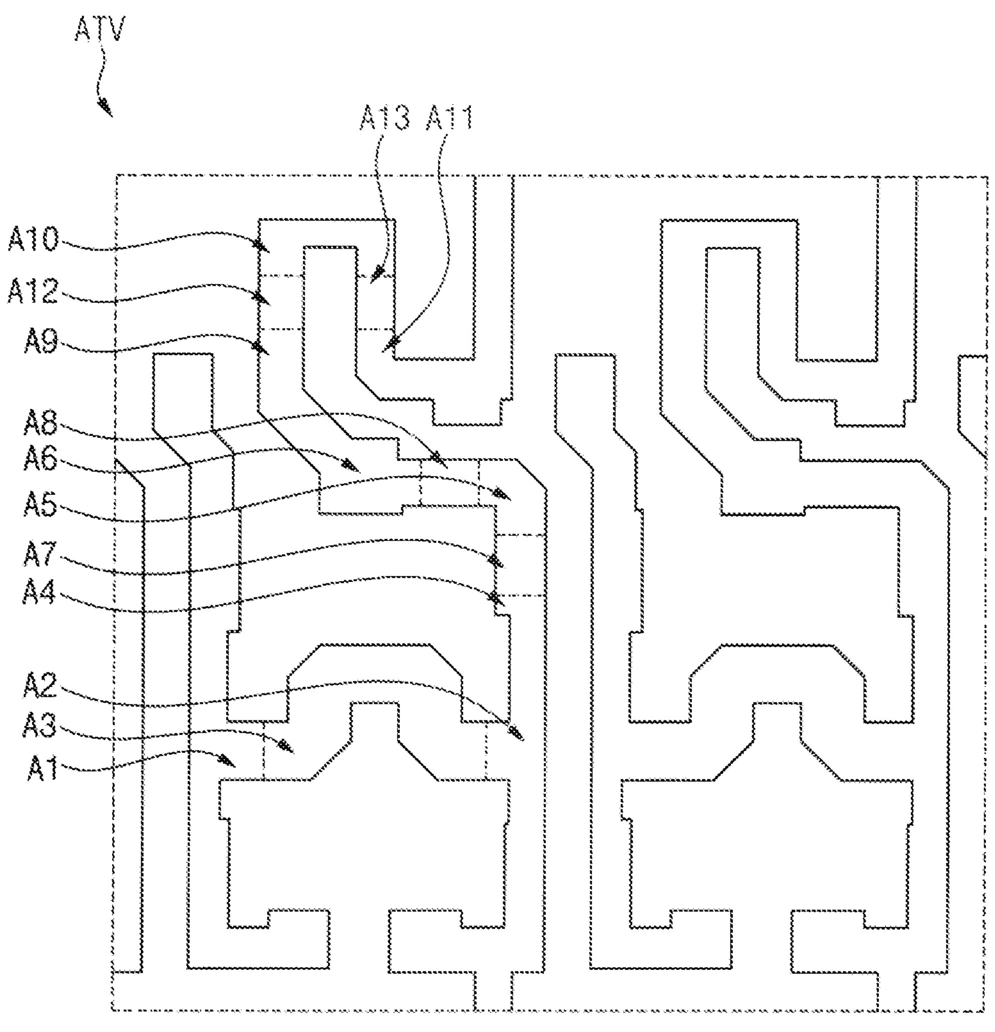
FIG. 3, FIG. 4, FIG. 5, FIG. 6, FIG. 7, FIG. 8, FIG. 9, and FIG. 10 are diagrams illustrating embodiments of the display device of FIG. 1.
Figure 3:
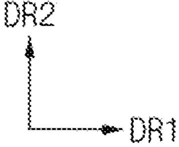
Figure 4:
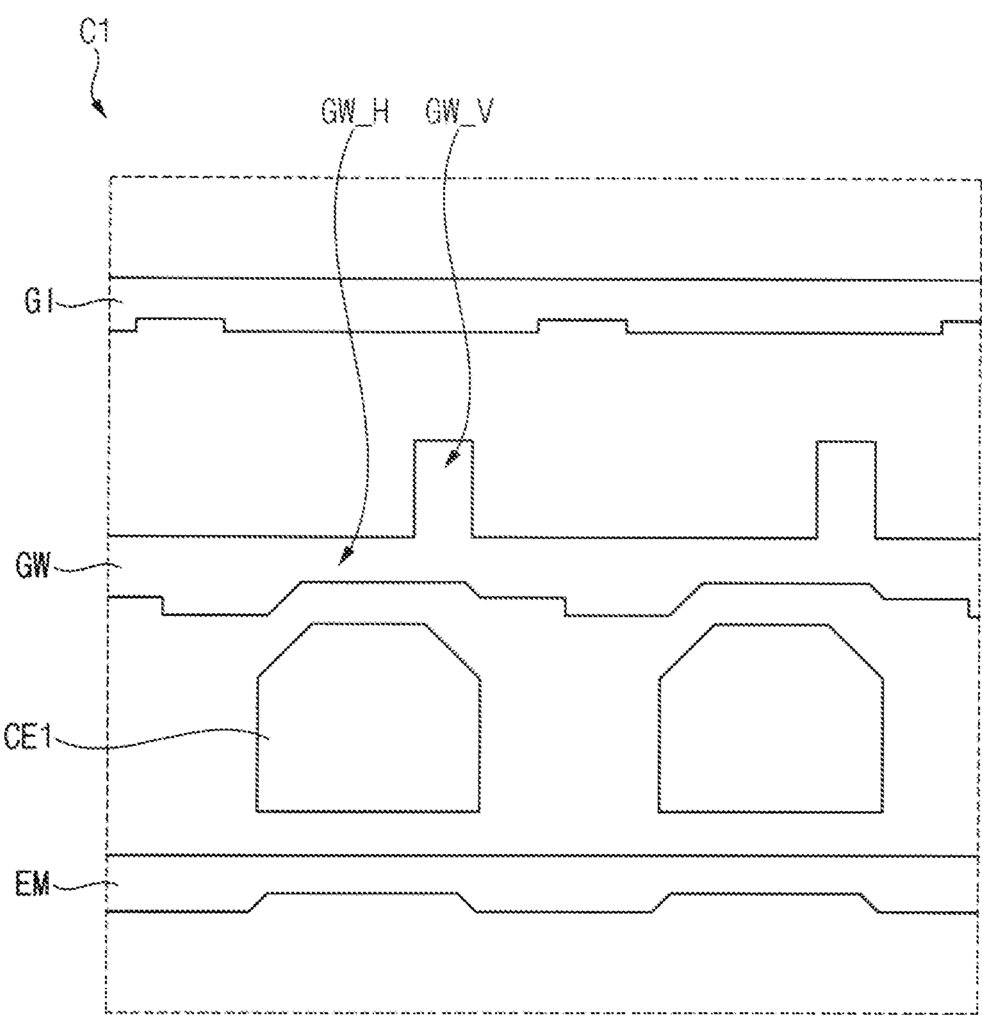
Figure 4:
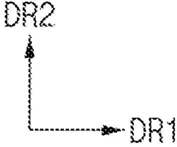
Figure 5:
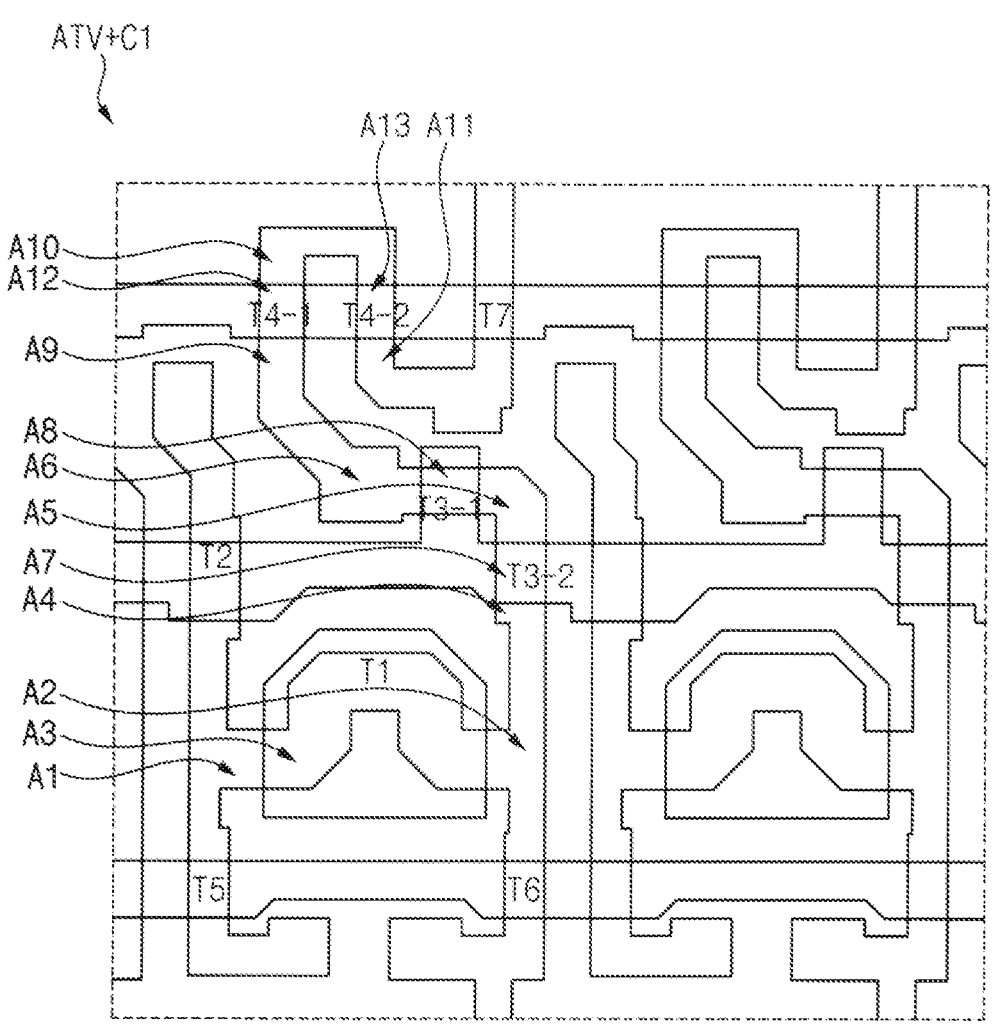
Figure 5:
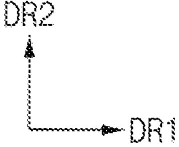
Figure 6:
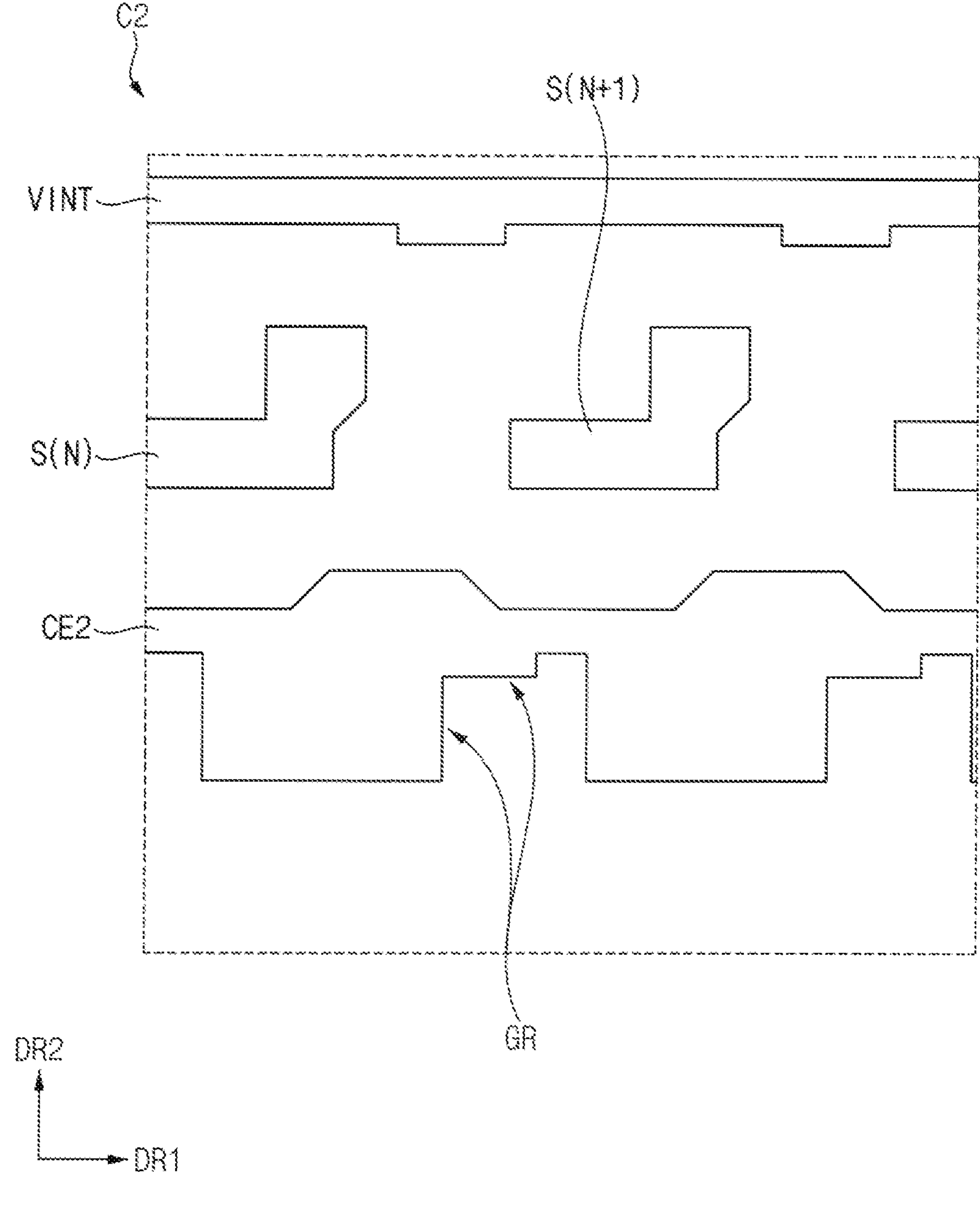
Figure 7:
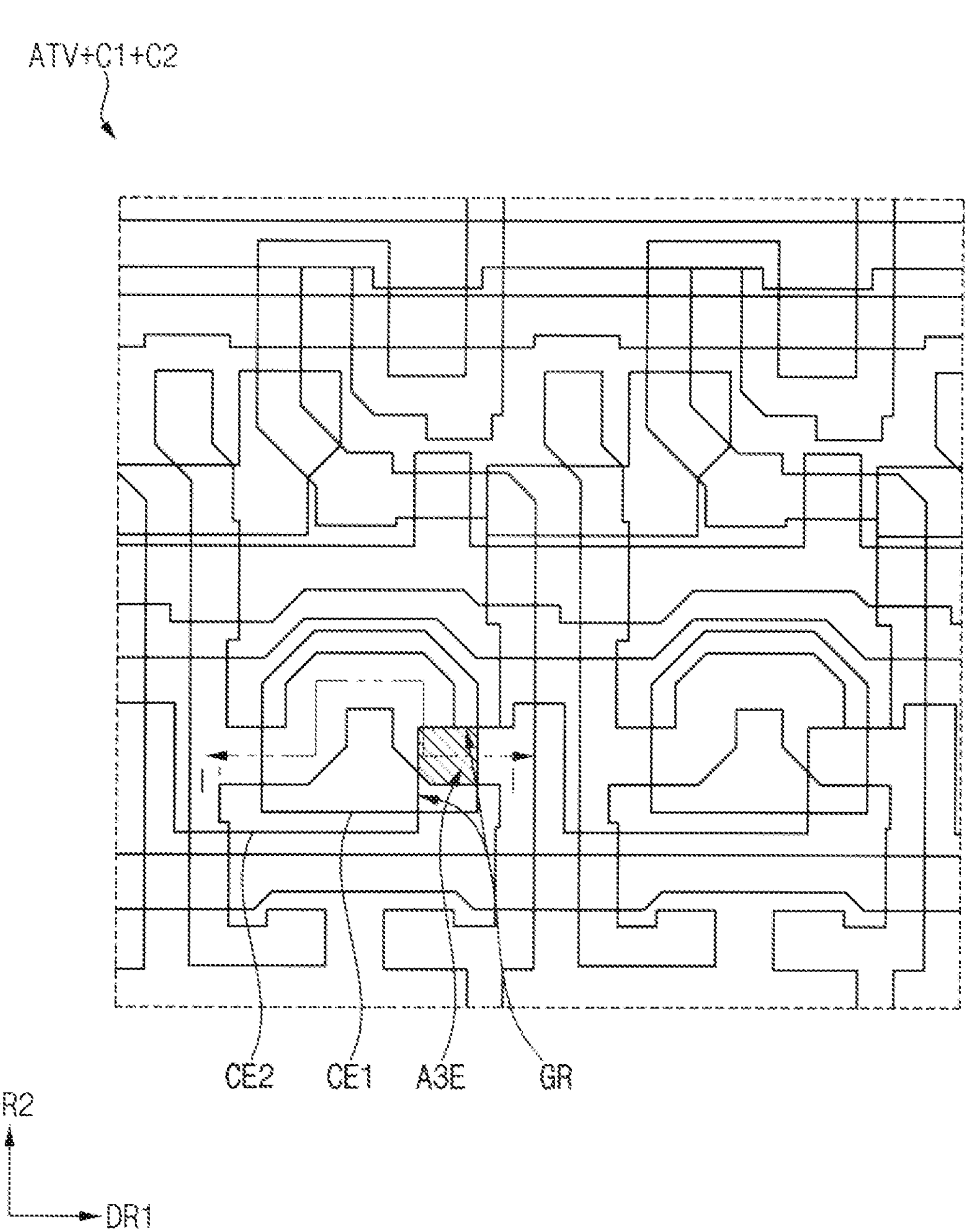
Figure 8:
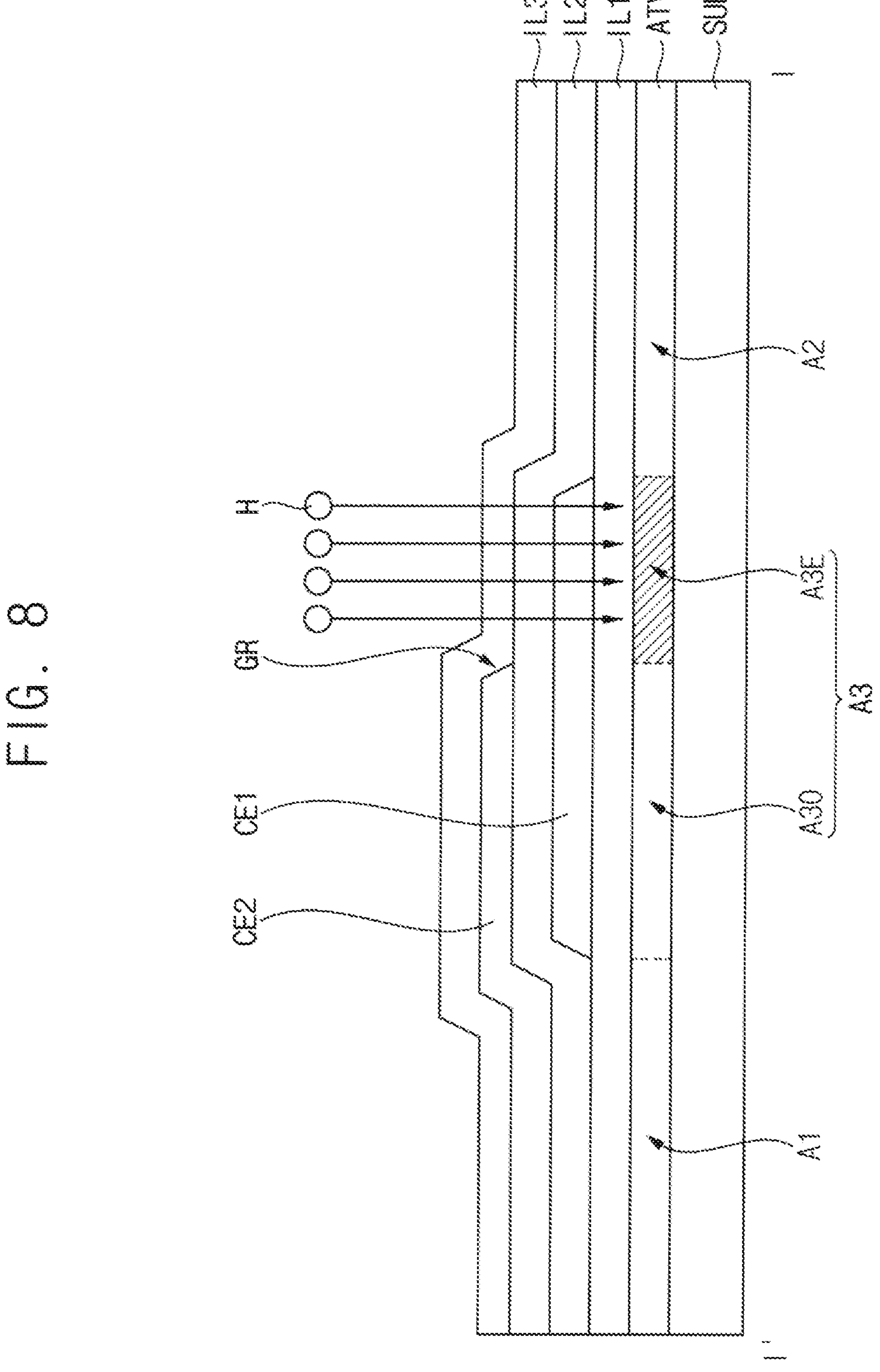
Figure 9:
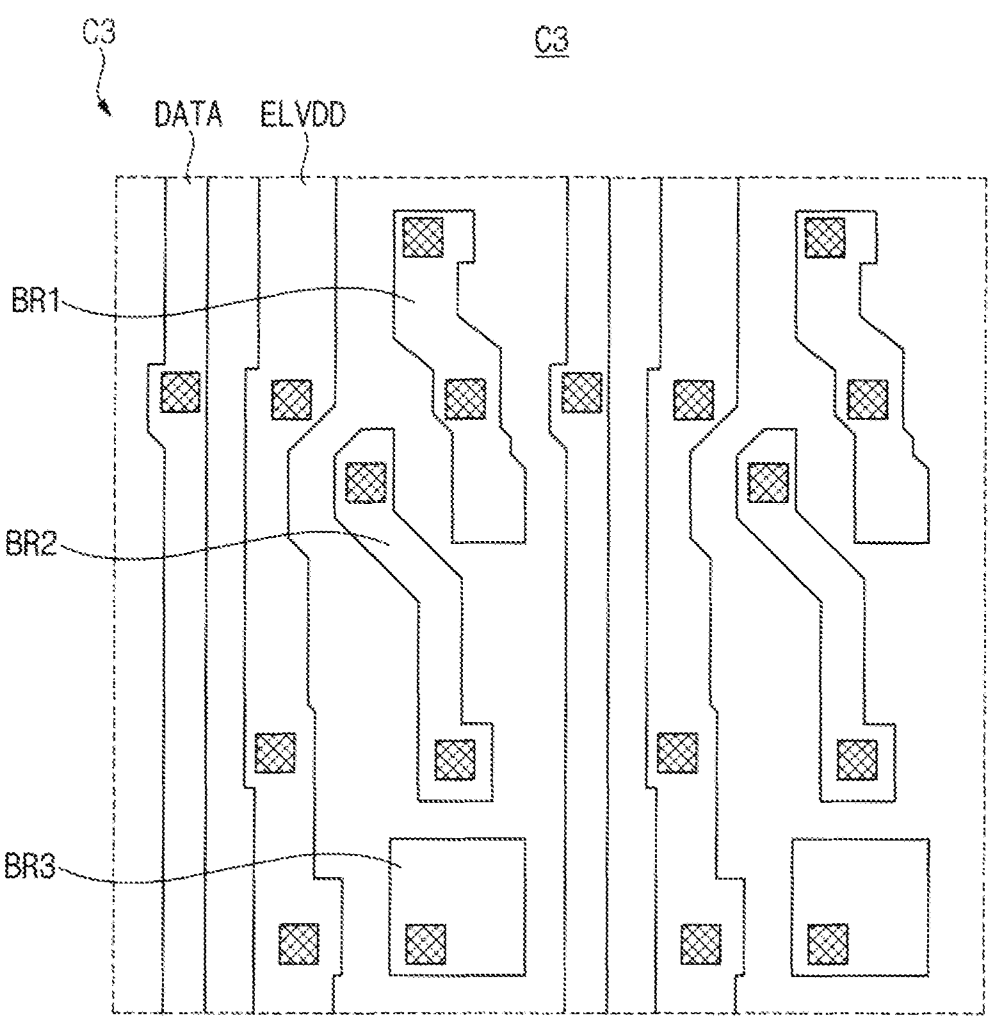
Figure 9:
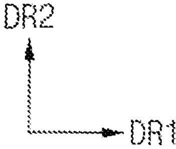
Figure 10:
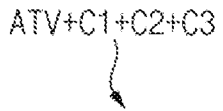
Figure 10:
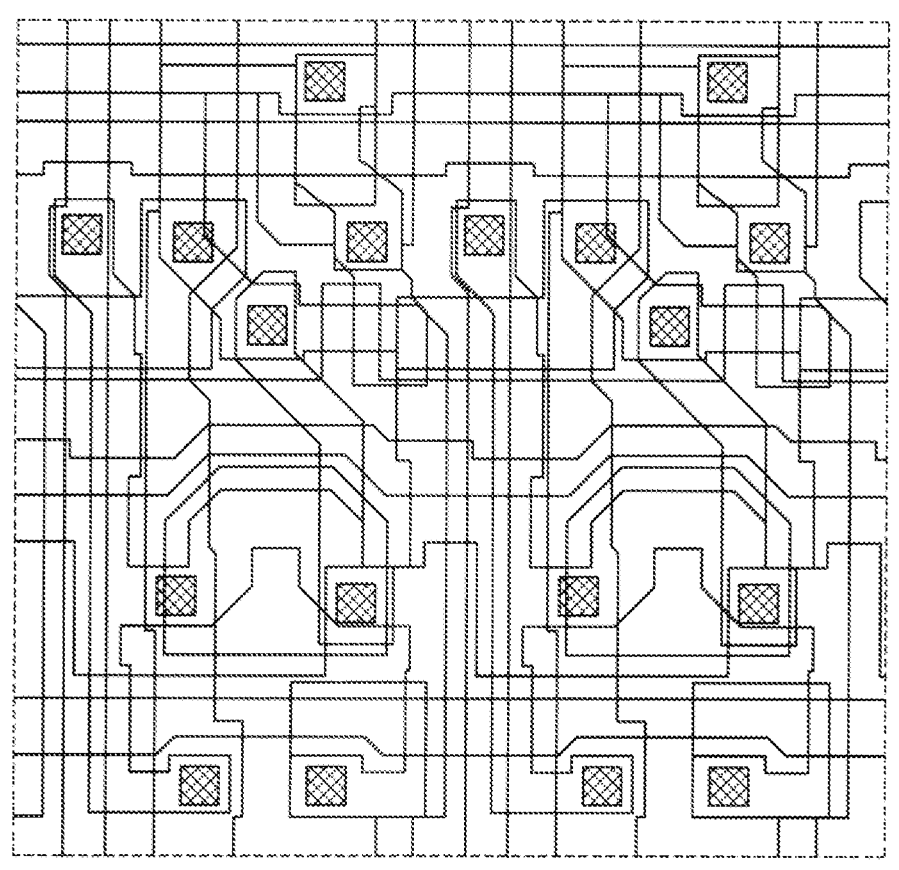
Figure 10:
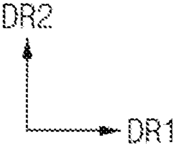

FIG. 3 is a plan view illustrating an embodiment of an active pattern ATV (e.g., active layer). FIG. 4 is a plan view illustrating an embodiment of a first conductive pattern C1. FIG. 5 is a plan view illustrating the active pattern ATV together with the first conductive pattern C1. FIG. 6 is a plan view illustrating an embodiment of a second conductive pattern C2. FIG. 7 is a plan view illustrating the active pattern ATV together with the first conductive pattern C1 and the second conductive pattern C2. FIG. 8 is a cross-sectional view taken along line of FIG. 7. FIG. 9 is a plan view illustrating an embodiment of a third conductive pattern C3. FIG. 10 is a plan view illustrating the active pattern ATV together with the first conductive pattern C1, the second conductive pattern C2 and the third conductive pattern C3.

Referring to FIG. 3, the active pattern ATV may include polycrystalline silicon. Alternatively, the active pattern ATV may include an oxide semiconductor.

The active pattern ATV may include a first region A1, a second region A2, and a third region A3. The second region A2 may be spaced apart from the first region A1 in (or along) the first direction DR1. The third region A3 may be located between the first region A1 and the second region A2. The third region A3 may connect the first region A1 to the second region A2.

In an embodiment, the active pattern ATV may include a fourth region A4, a fifth region A5, a sixth region A6, a seventh region A7, and an eighth region A8. The fourth region A4 may be adjacent to the second region A2 (e.g., closest to the second region A2 among the fourth region A4, the fifth region A5, the sixth region A6, the seventh region A7 and the eighth region A8). The fifth region A5 may be spaced apart from the fourth region A4 in the second direction DR2. The sixth region A6 may be spaced apart from the fifth region A5 in a direction opposite to the first direction DR1. The seventh region A7 may be located between the fourth region A4 and the fifth region A5. The eighth region A8 may be located between the fifth region A5 and the sixth region A6.

In an embodiment, the active pattern ATV may include a ninth region A9, a tenth region A10, an eleventh region A11, a twelfth region A12, and a thirteenth region A13. The ninth region A9 may be connected to the second region A2. In an embodiment, for example, the ninth region A9 may be connected to the second region A2 through the fourth region A4, the fifth region A5, the sixth region A6, the seventh region A7, and the eighth region A8. The tenth region A10 may be spaced apart from the ninth region A9 in the second direction DR2. The eleventh region A11 may be spaced apart from the tenth region A10 in a direction opposite to the second direction DR2, and may be spaced apart from the ninth region A9 in the first direction DR1. The twelfth region A12 may be located between the ninth region A9 and the tenth region A10. The thirteenth region A13 may be located between the tenth region A10 and the eleventh region A11.

Referring to FIG. 4, the first conductive pattern C1 may include a conductive material. In an embodiment, for example, the first conductive pattern C1 may include molybdenum.

The first conductive pattern C1 may include or define the initialization control line GI, the scan line GW, a first capacitor electrode CE1, and the light emitting control line EM. That is, the initialization control line GI, the scan line GW, the first capacitor electrode CE1, and the light emitting control line EM may be respective patterns of a first conductive material layer (e.g., the first conductive pattern C1).

The initialization control line GI may extend in the first direction DR1. The first initialization control signal may be provided through the initialization control line GI.

The scan line GW may be spaced apart from the initialization control line GI in the direction opposite to the second direction DR2. The scan signal may be provided through the scan line GW.

In an embodiment, the scan line GW may include an extension part GW_H extending in the first direction DR1, and a protrusion part GW_V extending in the second direction DR2. The extension part GW_H may have a major dimension extended along the first direction DR1, while the protrusion part GW_V (e.g., protrusion) may have a major dimension extended along the second direction DR2.

The first capacitor electrode CE1 may be spaced apart from the scan line GW in the direction opposite to the second direction DR2. The first capacitor electrode CE1 may be the first electrode of the capacitor CST.

The light emitting control line EM may be spaced apart from the first capacitor electrode CE1 in the direction opposite to the second direction DR2. The light emitting control signal may be provided through the light emitting control line EM.

Referring to FIG. 3, FIG. 4, and FIG. 5, the first conductive pattern C1 may be disposed on the active pattern ATV.

At least a portion of the first capacitor electrode CE1 may overlap the third region A3 and define (portions of) the first transistor T1. The gate electrode of the first transistor T1 may be a first capacitor electrode CE1. In this case, a source region of the first transistor T1 may be a first region A1, a drain region of the first transistor T1 may be a second region A2, and an active region of the first transistor T1 may be a third region A3.

At least a portion of the scan line GW may overlap the active pattern ATV and define the second transistor T2, the first compensation transistor T3-1, and the second compensation transistor T3-2.

In an embodiment, at least a portion of the protrusion part GW_V may overlap the eighth region A8 and define the first compensation transistor T3-1. A gate electrode of the first compensation transistor T3-1 may be the protrusion part GW_V. In this case, a source region of the first compensation transistor T3-1 may be the fifth region A5, a drain region of the first compensation transistor T3-1 may be the sixth region A6, and an active region of the first compensation transistor T3-1 may be the eighth region A8.

In an embodiment, at least a portion of the extension part GW_H may overlap the seventh region A7 and define the second compensation transistor T3-2. A gate electrode of the second compensation transistor T3-2 may be the extension part GW_H. In this case, a source region of the second compensation transistor T3-2 may be the fourth region A4, a drain region of the second compensation transistor T3-2 may be the fifth region A5, and an active region of the second compensation transistor T3-2 may be the seventh region A7.

At least a portion of the initialization control line GI may overlap the active pattern ATV and define the first initialization transistor T4-1, the second initialization transistor T4-2, and the seventh transistor T7.

In an embodiment, at least a portion of the initialization control line GI may overlap the twelfth region A12 and define the first initialization transistor T4-1. A gate electrode of the first initialization transistor T4-1 may be the initialization control line GI. In this case, a source region of the first initialization transistor T4-1 may be the ninth region A9, a drain region of the first initialization transistor T4-1 may be the tenth region A10, and an active region of the first initialization transistor T4-1 may be the twelfth region A12.

In an embodiment, at least a portion of the initialization control line GI may overlap the thirteenth region A13 and define the second initialization transistor T4-2. A gate electrode of the second initialization transistor T4-2 may be the initialization control line GI. In this case, a source region of the second initialization transistor T4-2 may be the tenth region A10, a drain region of the second initialization transistor T4-2 may be the eleventh region A11, and an active region of the second initialization transistor T4-2 may be the thirteenth region A13.

At least a portion of the light emitting control line EM may overlap the active pattern ATV and define the fifth transistor T5 and the sixth transistor T6.

Referring to FIG. 6, the second conductive pattern C2 may include a conductive material. In an embodiment, for example, the second conductive pattern C2 may include molybdenum.

The second conductive pattern C2 may include the initialization voltage line VINT, a plurality of stabilization patterns S(N) and S(N+1), and a second capacitor electrode CE2. That is, the initialization voltage line VINT, the plurality of stabilization patterns S(N) and S(N+1), and the second capacitor electrode CE2 may be respective patterns of a second conductive material layer (e.g., the second conductive pattern C2).

The initialization voltage line VINT may extend in the first direction DR1. The initialization voltage may be provided through the initialization voltage line VINT.

The plurality of the stabilization patterns S(N) and S(N+1) may be spaced apart from the initialization voltage line VINT in the direction opposite to the second direction DR2. The plurality of the stabilization patterns S(N) and S(N+1) may include a $N^{th}$ stabilization pattern S(N) and a $N+1^{th}$ stabilization pattern S(N+1). The $N^{th}$ stabilization pattern S(N) may be a pattern included in a pixel circuit PXC in the $n^{th}$ column, and the $N+1^{th}$ stabilization pattern S(N+1) may be included in a pixel circuit PXC in the $n+1^{th}$ column (where n is a natural number).

The second capacitor electrode CE2 may extend in the first direction DR1. The second capacitor electrode CE2 may be spaced apart from the plurality of stabilization patterns S(N) and S(N+1) in the direction opposite to the second direction DR2. The second capacitor electrode CE2 may include or define a groove GR. A shape of the groove GR may be substantially same as an outer shape of the second capacitor electrode CE2.

Referring to FIG. 7, the second conductive pattern C2 may be disposed on the first conductive pattern C1. In an embodiment, for example, the second capacitor electrode CE2 may be disposed on the first capacitor electrode CE1. The second capacitor electrode CE2 may face the first capacitor electrode CE1 along a thickness direction of the display device 100. The thickness direction may be defined as a third direction crossing each of the first direction DR1 and the second direction DR2.

At least a portion of the second capacitor electrode CE2 may overlap the first capacitor electrode CE1 and define a portion of the capacitor CST. The second capacitor electrode CE2 may define the groove GR, and accordingly, a portion of the first capacitor electrode CE1 may be exposed to outside the second conductive pattern C2 without overlapping the second capacitor electrode CE2. The portion of the first capacitor electrode CE1 exposed to outside the second conductive pattern C2 by the groove GR may be adjacent to the second region A2.

Referring to FIG. 3, FIG. 4, FIG. 5, FIG. 7, and FIG. 8, the active pattern ATV may be disposed on a substrate SUB.

A first insulation layer IL1 may be disposed on the active pattern ATV. The first insulation layer IL1 may cover the active pattern ATV.

The first capacitor electrode CE1 and a second insulation layer IL2 may be disposed in order on the first insulation layer ILL The second insulation layer IL2 may cover the first capacitor electrode CE1.

The second capacitor electrode CE2 and a third insulation layer IL3 may be disposed in order on the second insulation layer IL2. The third insulation layer IL3 may cover the second capacitor electrode CE2.

The first insulation layer ILL the second insulation layer IL2, and the third insulation layer IL3 may include an inorganic insulating material. In an embodiment, for example, the first insulation layer ILL the second insulation layer IL2, and the third insulation layer IL3 may include silicon nitride.

A hydrogen H may flow in a direction from the second insulation layer IL2 and the third insulation layer IL3 toward the first insulation layer IL1. The hydrogen H may contact the active pattern ATV and may reduce defects in the active pattern ATV.

When the hydrogen H flows into the active region (for example, the third region A3) of the first transistor T1 adjacent to the source region (for example, the first region A1) of the first transistor T1, a driving range of the first transistor T1 may be relatively decreased. The driving range may be defined as a voltage difference between the gate electrode of the first transistor T1 and the source region of the first transistor T1 when an electrical current of about 1 nanoamp (nA) to about 500 nanoamps (nA) flows through the first transistor T1.

When the driving range is relatively decreased, an intensity of the driving current may relatively largely change even with a relatively small change in voltage. Accordingly, a performance of the first transistor T1 may be relatively deteriorated, and a performance of the display device 100 may be deteriorated.

When the hydrogen H flows into the active region (for example, the third region A3) of the first transistor T1 adjacent to the drain region (for example, the second region A2) of the first transistor T1, a leakage current may be relatively small. The leakage current may be defined as a hole moving from the source region (for example, the first region A1) of the first transistor T1 to the drain region (for example, the second region A2) of the first transistor T1 through the active region (for example, the third region A3) of the first transistor T1 when a voltage difference between the gate electrode (for example, the first capacitor electrode CE1) of the first transistor T1 and the source region (for example, the first region A1) of the first transistor T1 is greater than 0 volts (V).

The hydrogen H flowing into the active region (for example, the third region A3) of the first transistor T1 adjacent to the drain region (for example, the second region A2) of the first transistor T1 may cause the leakage current to be relatively small. Accordingly, the performance of the first transistor T1 may be relatively improved, and the performance of the display device 100 may be improved.

The first capacitor electrode CE1 may block a part of the hydrogen H flowing into the active pattern ATV. An amount of the hydrogen H blocked by the first capacitor electrode CE1 may be relatively small. Accordingly, a relatively large amount of the hydrogen H may pass through the first capacitor electrode CE1 and flow into the active pattern ATV.

The second capacitor electrode CE2 may block a part of the hydrogen H flowing into the active pattern ATV. When the second capacitor electrode CE2 and the first capacitor electrode CE1 overlap each other, a relatively large amount of the hydrogen H may be blocked by the first and the second capacitor electrodes CE1 and CE2 overlapping each other. Accordingly, a relatively small amount of the hydrogen H or substantially no hydrogen H may flow into the active pattern ATV at an overlapping area where the first capacitor electrode CE1 and the second capacitor electrode CE2 face each other and overlap each other along the thickness direction.

In an embodiment, the third region A3 may include a first overlapping region A3O and a first opening region A3E (e.g., first exposed region). The first overlapping region A3O may be an area of the third region A3 at which the first capacitor electrode CE1 and the second capacitor electrode CE2 overlap each other. The first opening region A3E may be an area of the third region A3 at which the first capacitor electrode CE1 is exposed to outside the second conductive pattern C2 by the groove GR of the second capacitor electrode CE2. In other words, the first opening region A3E may be an area of the third region A3 which does not overlap the second capacitor electrode CE2 and overlaps only the first capacitor electrode CE1 of the capacitor CST.

Among the source region and the drain region within the first transistor T1, the first overlapping region A3O may be adjacent to the source region (for example, closer to the first region A1) of the first transistor T1, and the first opening region A3E may be adjacent to the drain region (for example, closer to the second region A2) of the first transistor T1. Accordingly, a relatively small amount of the hydrogen H or substantially no hydrogen H may flow into the third region A3 at the first overlapping region A3O, and a relatively large amount of the hydrogen H may flow into the third region A3 at the first opening region A3E. In this case, the performance of the first transistor T1 may be improved.

The first opening region A3E and the first overlapping region A3O may each include a planar area defined along a plane defined by the first direction DR1 and the second direction DR2 crossing each other. In an embodiment, the planar area of the first opening region A3E may be smaller than the planar area of the first overlapping region A3O. Accordingly, a relatively small amount of the hydrogen H may flow into the third region A3.

Referring to FIG. 9 and FIG. 10, the third conductive pattern C3 may include a conductive material. The third conductive pattern C3 may be disposed on the second conductive pattern C2. The third conductive pattern C3 may be further from the substrate SUB than both the first conductive pattern C1 and the second conductive pattern C2.

The third conductive pattern C3 may include the data line DATA, the first power voltage line ELVDD, a first bridge electrode BR1, a second bridge electrode BR2, and a third bridge electrode BR3. That is, the data line DATA, the first power voltage line ELVDD, the first bridge electrode BR1, the second bridge electrode BR2, and the third bridge electrode BR3 may be respective patterns of a third conductive material layer (e.g., the third conductive pattern C3).

The data line DATA may extend in the second direction DR2. The data line DATA may be electrically connected to the active pattern ATV. The data line DATA may provide the data signal to the second transistor T2.

The first power voltage line ELVDD may extend in the second direction DR2. The first power voltage line ELVDD may be spaced apart from the data line DATA in the first direction DR1. The first power voltage line ELVDD may be electrically connected to the $n^{th}$ stabilization pattern S(N), the second capacitor electrode CE2, and the active pattern ATV. The first power voltage line ELVDD may provide a first power voltage to the $n^{th}$ stabilization pattern S(N), the second electrode of the capacitor CST, and the fifth transistor T5.

The first bridge electrode BR1 may extend in the second direction DR2. The first bridge electrode BR1 may be spaced apart from the first power voltage line ELVDD in the first direction DR1. The first bridge electrode BR1 may connect the initialization voltage line VINT and the active pattern ATV to each other. In an embodiment, for example, the first bridge electrode BR1 may connect the initialization voltage line VINT and the eleventh region A11 to each other.

The second bridge electrode BR2 may extend in the second direction DR2. The second bridge electrode BR2 may be spaced apart from the first power voltage line ELVDD in the first direction DR1. The second bridge electrode BR2 may connect the active pattern ATV and the first capacitor electrode CE1 to each other. In an embodiment, for example, the second bridge electrode BR2 may connect the sixth region A6 and the first capacitor electrode CE1 to each other.

In an embodiment, the second bridge electrode BR2 may contact an upper surface of the first capacitor electrode CE1 which is furthest from the substrate SUB and exposed to outside the second conductive pattern C2 by the groove GR defined by an outer edge of the second capacitor electrode CE2.

The third bridge electrode BR3 may be connected to the active pattern ATV and the anode electrode of the light emitting diode DIOD to each other.

Figure 11:
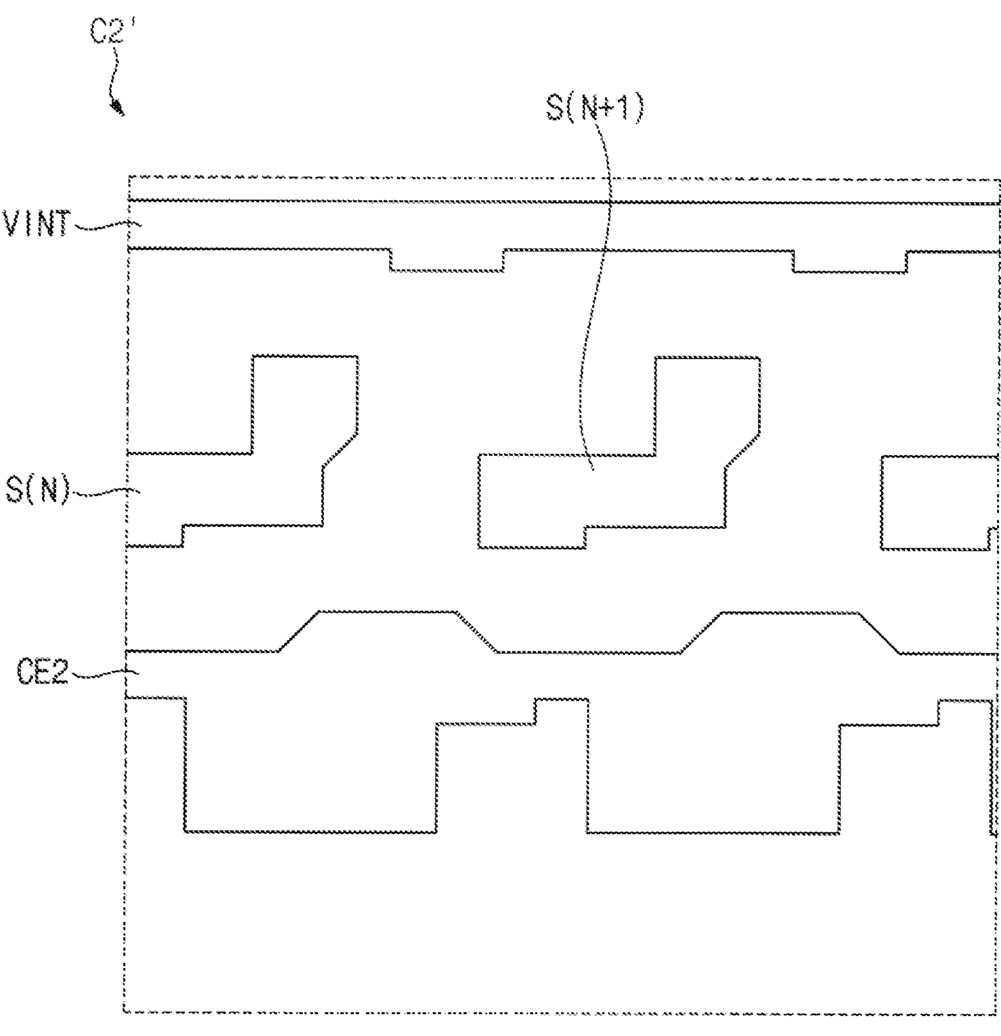
FIG. 11, FIG. 12, FIG. 13, and FIG. 14 are diagrams illustrating embodiments of a second conductive pattern and a third conductive pattern included in a display device.
Figure 11:
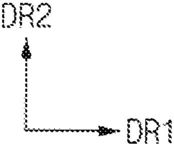
Figure 12:
Figure 12:
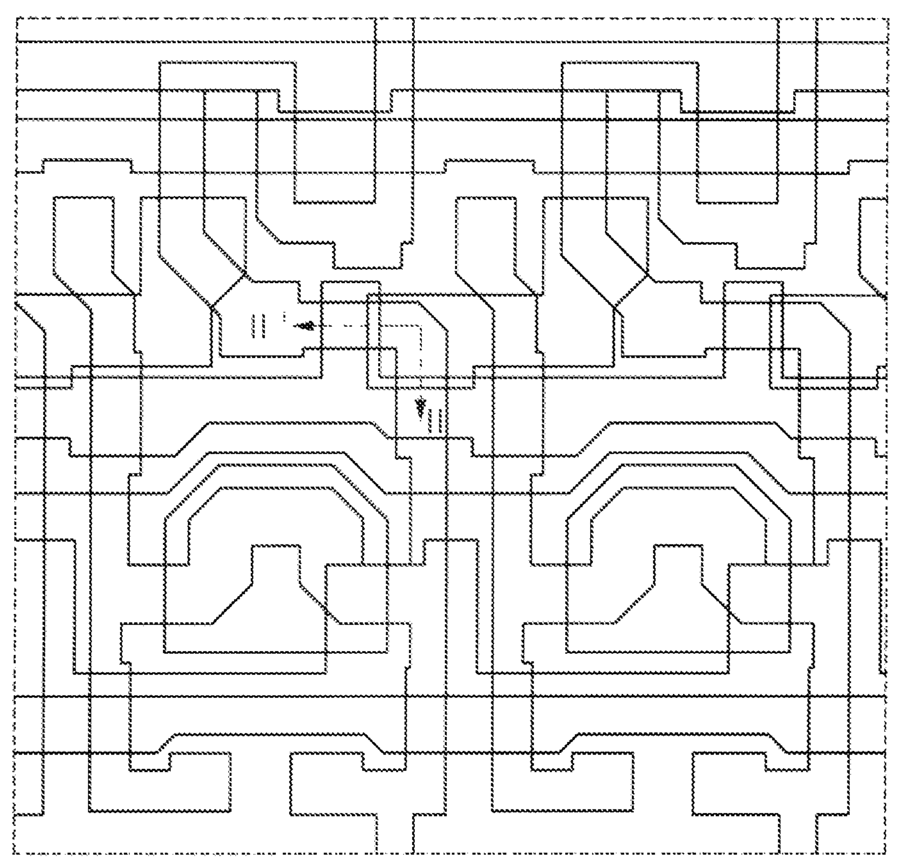
Figure 12:
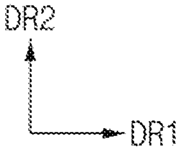
Figure 13:
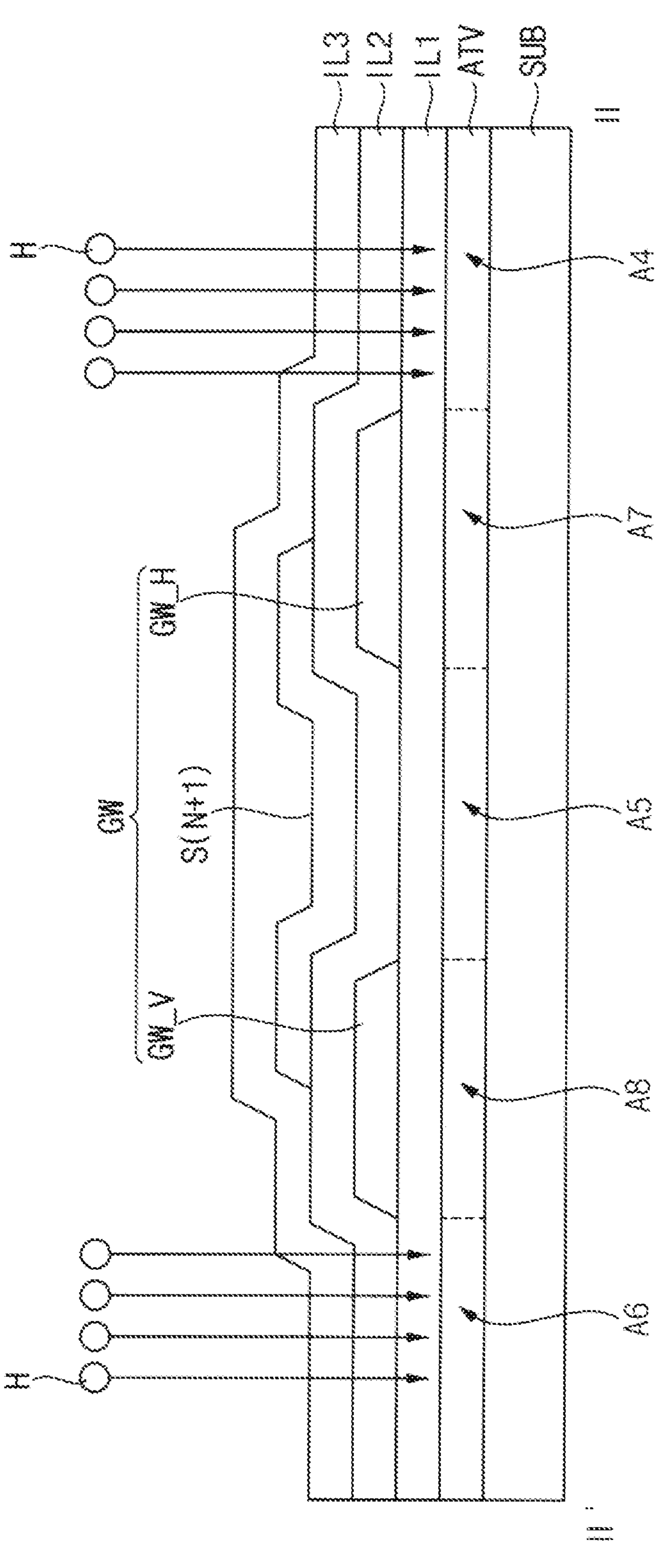
Figure 14:
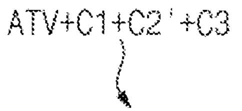
Figure 14:
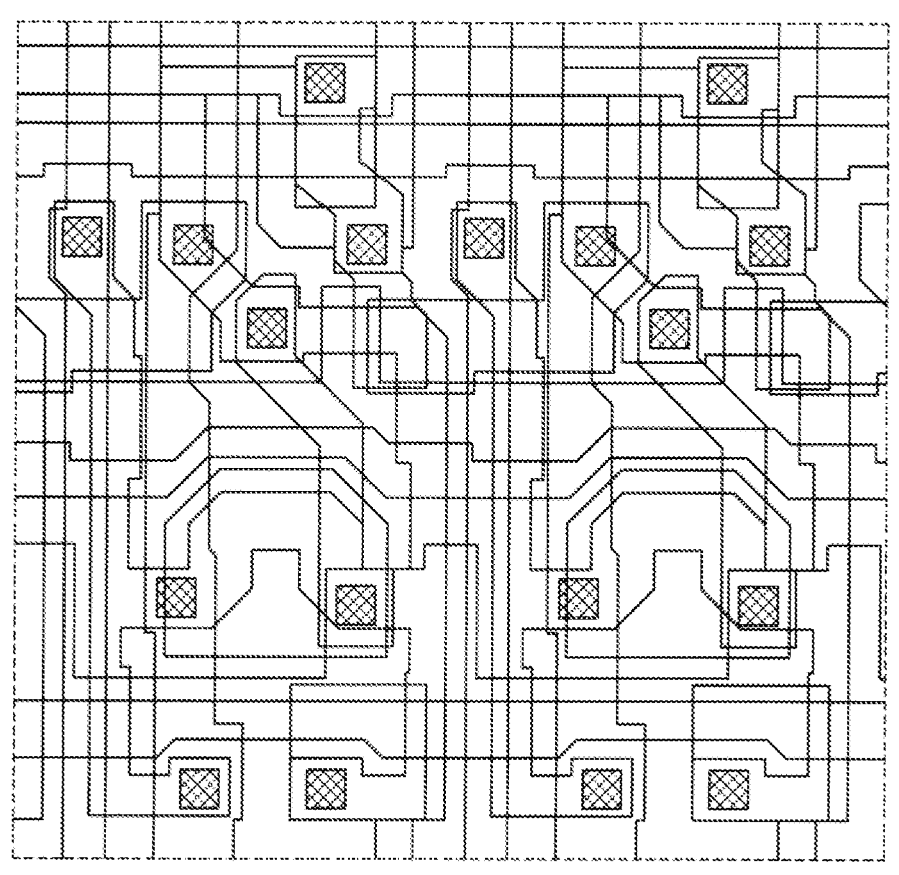
Figure 14:
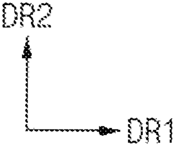

FIG. 11, FIG. 12, FIG. 13, and FIG. 14 are diagrams illustrating embodiments of a second conductive pattern C2' and a third conductive pattern C3 included in a display device 100. FIG. 11 is a plan view illustrating an embodiment of a second conductive pattern C2'. FIG. 12 is a plan view illustrating the active pattern ATV together with the first conductive pattern C1 and the second conductive pattern C2'. FIG. 13 is a cross-sectional view taken along line II-IF of FIG. 12. FIG. 14 is a plan view illustrating the active pattern ATV together with the first conductive pattern C1, the second conductive pattern C2' and the third conductive pattern C3.

Referring to FIG. 11, FIG. 12, and FIG. 13, the second conductive pattern C2' may be substantially same as the second conductive pattern C2 described with reference to FIG. 6, FIG. 7, FIG. 8, FIG. 9, and FIG. 10, except for shapes of the stabilization electrodes S(N) and S(N+1).

In an embodiment, at least a portion of the $N+1^{th}$ stabilization pattern S(N+1) may overlap the fifth region A5. In this case, at least another portion of the N+1th stabilization pattern S(N+1) may overlap the protrusion part GW_V and the extension part GW_H. The $N+1^{th}$ stabilization pattern S(N+1) may block a part of the hydrogen H flowing into the fifth region A5. Within the first compensation transistor T3-1 and the second compensation transistor T3-2, an opening region may be defined for the seventh region A7 and the eighth region A8 which is furthest from the $N+1^{th}$ stabilization pattern S(N+1) and from the fifth region A5. Accordingly, a relatively small amount of the hydrogen H or substantially no hydrogen H may flow into the fifth region A5.

When a relatively small amount of the hydrogen H flows into the fifth region A5 and a relatively large amount of the hydrogen H flows into the fourth region A4 and sixth region A6, a leakage current of the first compensation transistor T3-1 and the second compensation transistor T3-2 may be reduced. Accordingly, a performance of the first compensation transistor T3-1 and the second compensation transistor T3-2 may be improved.

Referring to FIG. 14, the third conductive pattern C3 may be disposed on the second conductive pattern C2'. The third conductive pattern C3 may be substantially same as the third conductive pattern C3 described with reference to FIG. 9 and FIG. 10.

Figure 15:
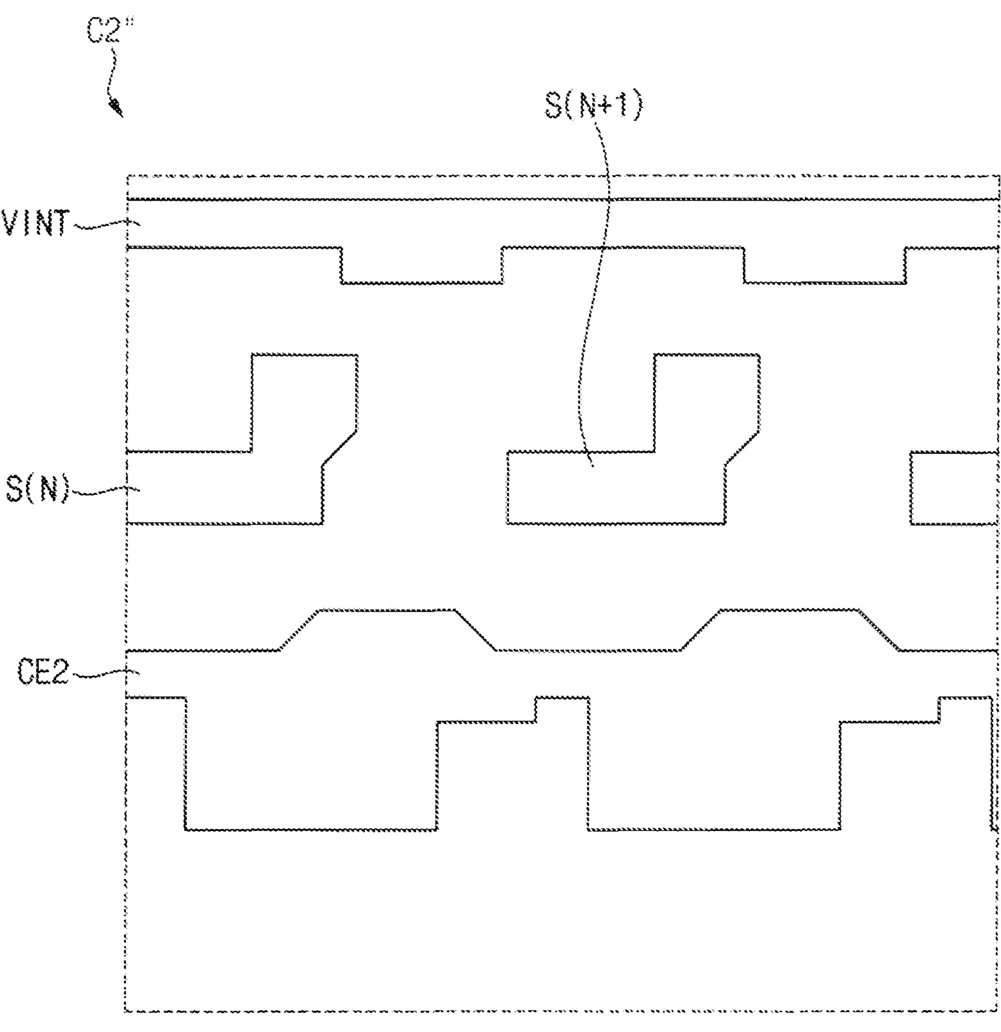
FIG. 15, FIG. 16, FIG. 17, and FIG. 18 are diagrams illustrating embodiments of a second conductive pattern and a third conductive pattern included in a display device.
Figure 15:
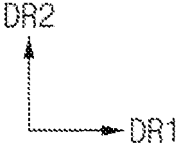
Figure 16:
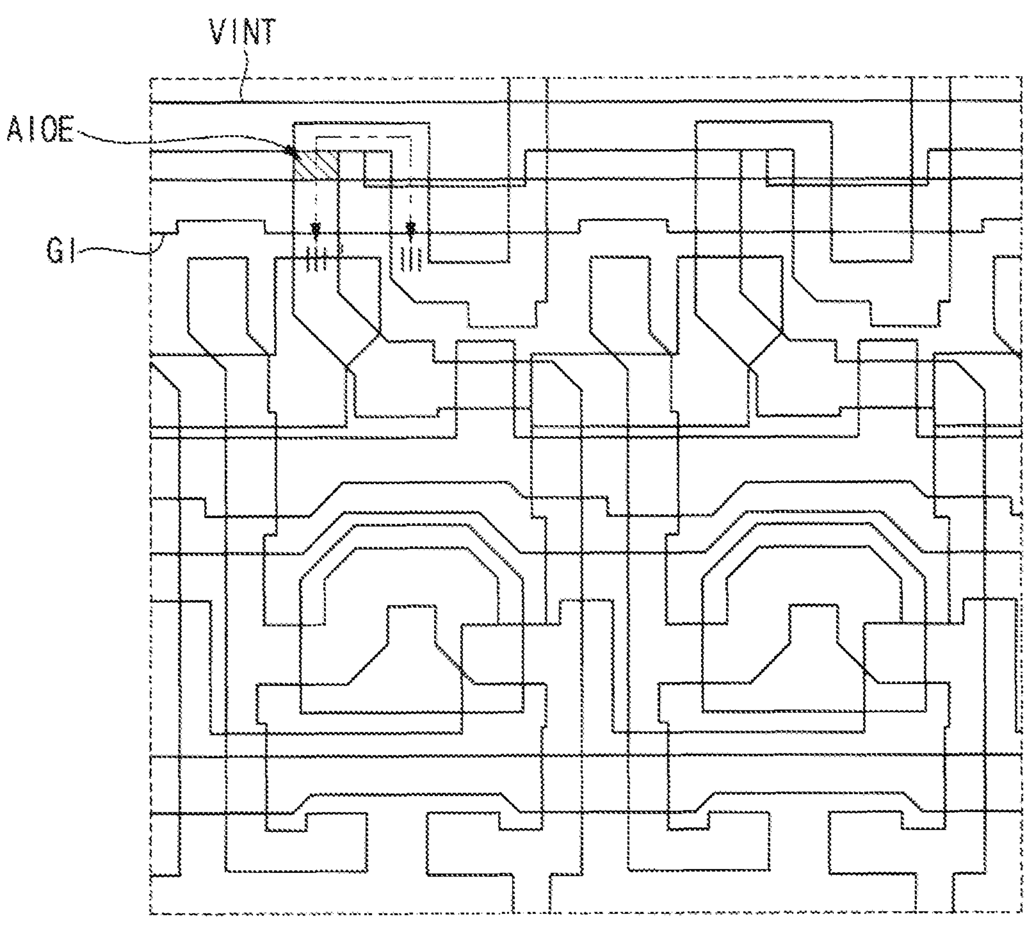
Figure 16:
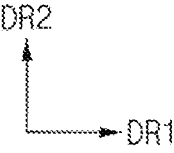
Figure 17:
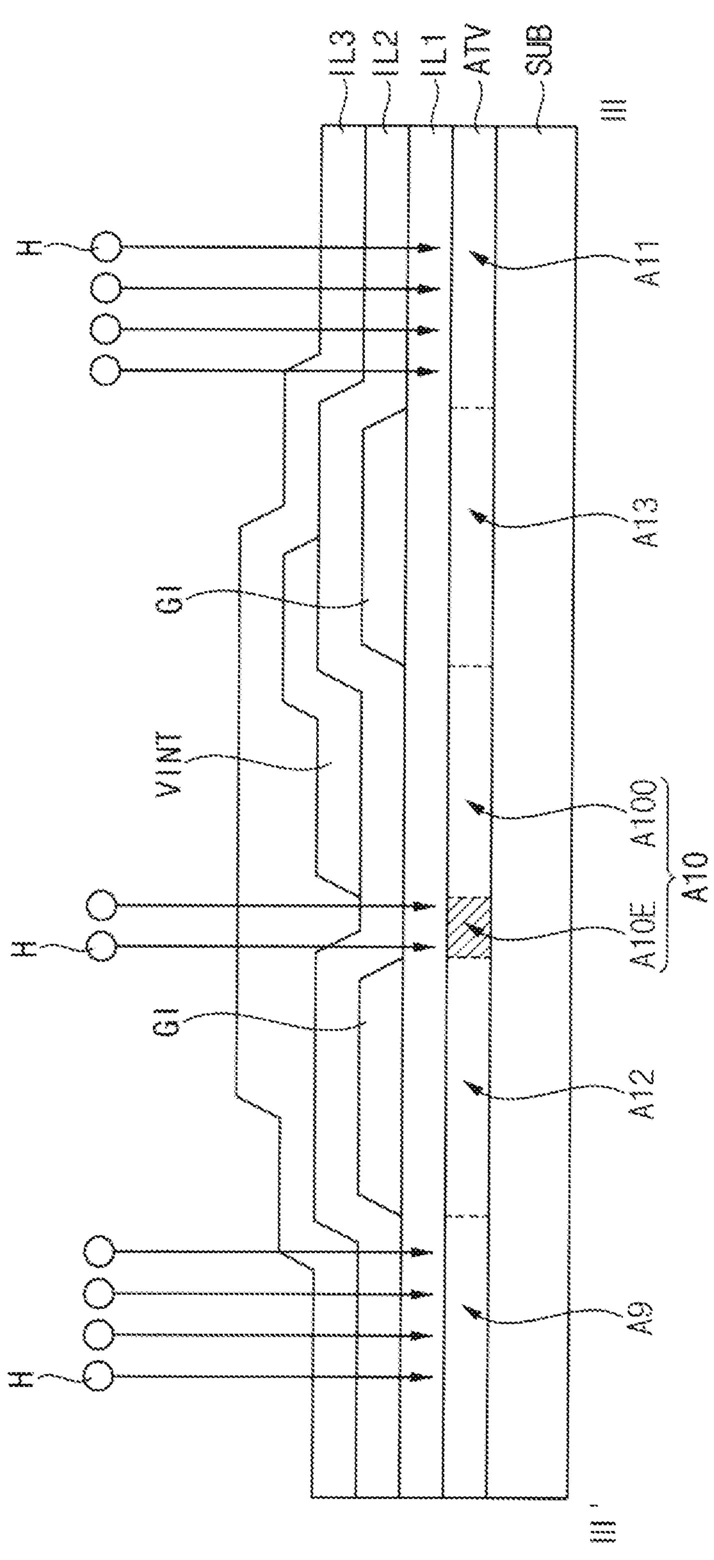
Figure 18:
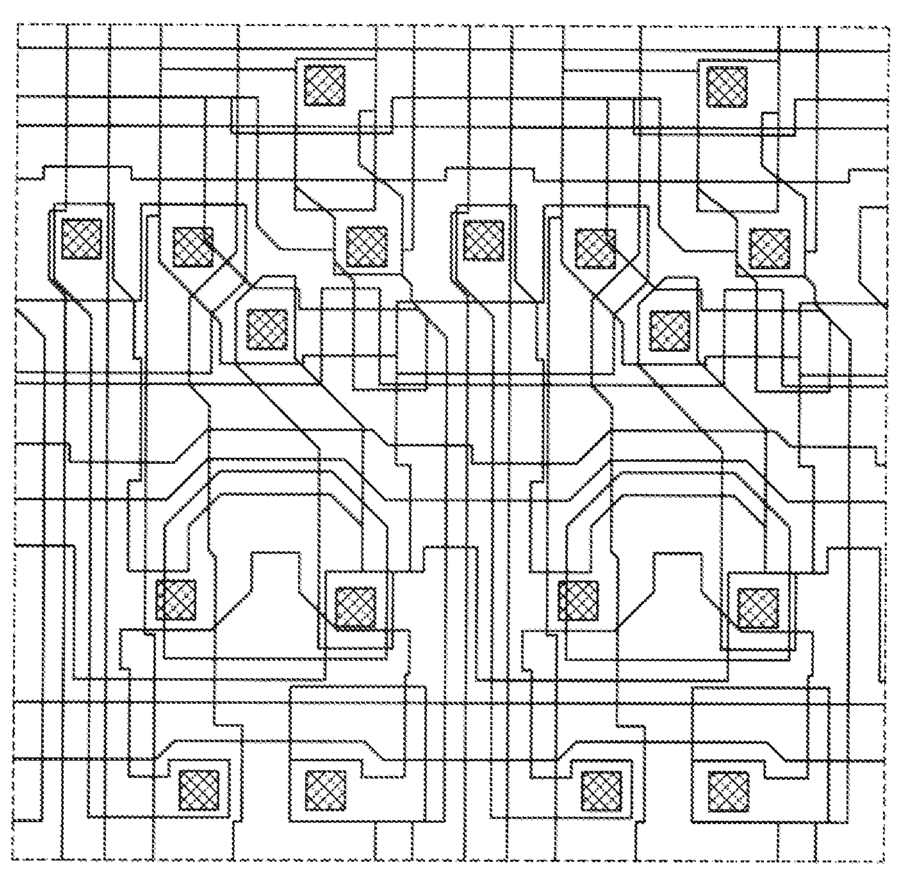
Figure 18:
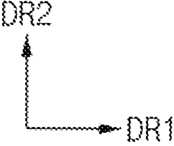

FIG. 15, FIG. 16, FIG. 17, and FIG. 18 are diagrams illustrating embodiments of a second conductive pattern C2" and a third conductive pattern C3 included in a display device 100. FIG. 15 is a plan view illustrating an embodiment of a second conductive pattern C2". FIG. 16 is a plan view illustrating the active pattern ATV together with the first conductive pattern C1 and the second conductive pattern C2". FIG. 17 is a cross-sectional view taken along line of FIG. 16. FIG. 18 is a plan view illustrating the active pattern ATV together with the first conductive pattern C1, the second conductive pattern C2" and the third conductive pattern C3.

Referring to FIG. 15, FIG. 16, and FIG. 17, the second conductive pattern C2" may be substantially same as the second conductive pattern C2 described with reference to FIG. 6, FIG. 7, FIG. 8, FIG. 9, and FIG. 10, except for shape of the initialization voltage line VINT.

In an embodiment, at least a portion of the initialization voltage line VINT may overlap the tenth region A10. In this case, the tenth region A10 may include a second overlapping region A10O and a second opening region A10E (e.g., second exposed region). The second overlapping region A10O may overlap the initialization voltage line VINT and may be adjacent to the thirteenth region A13 (e.g., closest to the thirteen region A13). The second opening region A10E may not overlap the initialization voltage line VINT and may be adjacent to the twelfth region A12 (e.g., closest to the twelfth region A12).

The initialization voltage line VINT may block a part of the hydrogen H flowing into the second overlapping region A10O. In other words, a relatively small amount of the hydrogen H or substantially no hydrogen H may flow into the second overlapping region A10O. A relatively large amount of the hydrogen H may flow into the second opening region A10E.

The second overlapping region A10O may be the source region of the second initialization transistor T4-2. Accordingly, a relatively small amount of the hydrogen H or substantially no hydrogen H may flow into the source region of the second initialization transistor T4-2.

The second opening region A10E may be the drain region of the first initialization transistor T4-1. Accordingly, a relative large amount of the hydrogen H may flow into the drain region of the first initialization transistor T4-1.

Although embodiments and implementations have been described herein, other embodiments and modifications will be apparent from this description. Accordingly, the invention is not limited to such embodiments, but rather various obvious modifications and equivalent arrangements would be apparent to a person of ordinary skill in the art.

What is claimed is:

1. A display device comprising:
- an active pattern comprising a first region, a second region spaced apart from the first region in a first direction, and a third region between the first region and the second region; and
- in order from the active pattern along a thickness direction of the display device:
  - a first capacitor electrode which overlaps the third region of the active pattern along the thickness direction to define portions of a driving transistor, the first capacitor electrode having an outer edge closest to a boundary between the second region and the third region of the active pattern, along the first direction; and
  - a second capacitor electrode which overlaps the first region and the first capacitor electrode, the second capacitor electrode having an outer edge which is closest to the boundary between the second region and the third region of the active pattern, along the first direction, and defines a groove overlapping the outer edge of the first capacitor electrode.

2. The display device of claim 1, wherein the first region is a source region of the driving transistor, the second region is a drain region of the driving transistor, and the third region is an active region of the driving transistor.

3. The display device of claim 1, wherein the third region of the active pattern comprises:
- a first overlapping region overlapping the second capacitor electrode; and
- a first exposed region corresponding to the groove of the second capacitor electrode.

4. The display device of claim 3, wherein within the driving transistor:
- the first exposed region of the third region is adjacent to the second region, and
- the first overlapping region of the third region is adjacent to the first region.

5. The display device of claim 3, wherein within the third region of the active pattern:
- each the first exposed region and the first overlapping region has a planar area, and
- the planar area of the first exposed region is smaller than the planar area of the first overlapping region.

6. The display device of claim 1, wherein the active pattern further comprises:
- a fourth region adjacent to the second region;
- a fifth region spaced apart from the fourth region in a second direction crossing the first direction;
- a sixth region spaced apart from the fifth region in a direction opposite to the first direction;
- a seventh region between the fourth region and the fifth region; and
- an eighth region between the fifth region and the sixth region.

7. The display device of claim 6, further comprising:
- a first conductive material layer including a scan line and the first capacitor electrode, and
- the scan line including:
  - an extension part extending along the first direction, and
  - a protrusion part protruding in the second direction and spaced apart from the first capacitor electrode in the second direction.

8. The display device of claim 7, wherein
- the protrusion part of the scan line overlaps the eighth region of the active pattern to define portions of a first compensation transistor, and
- the extension part of the scan line overlaps the seventh region of the active pattern to define portions of a second compensation transistor.

9. The display device of claim 8, wherein
- the fourth region is a source region of the second compensation transistor,
- the fifth region is a drain region of the second compensation transistor and a source region of the first compensation transistor,
- the sixth region is a drain region of the first compensation transistor,
- the seventh region is an active region of the second compensation transistor, and
- the eighth region is an active region of the first compensation transistor.

10. The display device of claim 9, further comprising:
- in order along the thickness direction of the display device, the first capacitor electrode, the second capacitor electrode and a bridge electrode, and
- the bridge electrode connecting the sixth region of the active pattern and the first capacitor electrode to each other.

11. The display device of claim 10, wherein the bridge electrode is connected to the portion of the first capacitor electrode which corresponds to the groove of the second capacitor electrode.

12. The display device of claim 7, further comprising:

a second conductive material layer including a stabilization pattern and the second capacitor electrode, and the stabilization pattern spaced apart from the second capacitor electrode in the second direction.

13. The display device of claim 12, wherein the stabilization pattern overlaps the fifth region of the active pattern and the scan line, the scan line overlaps the seventh region and the eighth region of the active pattern, and the sixth region and the fourth region of the active pattern are exposed to outside both the stabilization pattern and the scan line to define a drain region of a first compensation transistor and a source region of a second compensation transistor, respectively.

14. The display device of claim 1, wherein the active pattern further comprises:

a ninth region connected to the second region;

a tenth region spaced apart from the ninth region in a second direction crossing the first direction;

an eleventh region spaced apart from the tenth region in a direction opposite to the second direction and spaced apart from the ninth region in the first direction;

a twelfth region between the ninth region and the tenth region; and a thirteenth region between the tenth region and the eleventh region.

15. The display device of claim 14, further comprising:

a first conductive material layer including an initialization control line and the first capacitor electrode, and the initialization control line spaced apart from the first capacitor electrode in the second direction and extending along the first direction.

16. The display device of claim 15, wherein the initialization control line overlaps the twelfth region and the thirteenth region of the active pattern to define portions of a first initialization transistor and a second initialization transistor, respectively.

17. The display device of claim 15, further comprising:

a second conductive material layer including an initialization voltage line and the second capacitor electrode, and the initialization voltage line spaced apart from the second capacitor electrode in the second direction and extending along the first direction.

18. The display device of claim 17, wherein the initialization voltage line overlaps the tenth region of the active pattern.

19. The display device of claim 18, wherein the tenth region of the active pattern comprises:

a second overlapping region overlapping the initialization voltage line and adjacent to the thirteenth region; and a second exposed region adjacent to the twelfth region and exposed to outside both the initialization voltage line and the initialization control line.

* * * * *